(12) United States Patent
Park et al.

(10) Patent No.: US 10,818,859 B2
(45) Date of Patent: Oct. 27, 2020

(54) ELECTROLUMINESCENT DEVICE, AND DISPLAY DEVICE COMPRISING THEREOF

(71) Applicant: SAMSUNG ELECTRONICS CO., LTD., Suwon-si, Gyeonggi-do (KR)

(72) Inventors: Kun Su Park, Seongnam-si (KR); Kwanghee Kim, Seoul (KR); Tae Ho Kim, Suwon-si (KR); Eun Joo Jang, Suwon-si (KR); Won Sik Yoon, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 21 days.

(21) Appl. No.: 16/233,567

(22) Filed: Dec. 27, 2018

(65) Prior Publication Data

US 2020/0067005 A1   Feb. 27, 2020

(30) Foreign Application Priority Data

Aug. 21, 2018  (KR) .................. 10-2018-0097450

(51) Int. Cl.
*H01L 51/50* (2006.01)
*H01L 51/00* (2006.01)

(52) U.S. Cl.
CPC .......... *H01L 51/502* (2013.01); *H01L 51/005* (2013.01); *H01L 51/0039* (2013.01); *H01L 51/5004* (2013.01); *H01L 51/5088* (2013.01); *H01L 51/5056* (2013.01); *H01L 51/5072* (2013.01); *H01L 2251/303* (2013.01)

(58) Field of Classification Search
CPC combination set(s) only.
See application file for complete search history.

(56) References Cited

U.S. PATENT DOCUMENTS

| | | | |
|---|---|---|---|
| 10,003,037 B2 | 6/2018 | Luchinger et al. | |
| 2005/0236556 A1* | 10/2005 | Sargent | C09K 11/02 250/214.1 |
| 2016/0079316 A1* | 3/2016 | Zhou | H01L 33/06 257/13 |

FOREIGN PATENT DOCUMENTS

| | | |
|---|---|---|
| KR | 20100052926 A | 5/2010 |
| KR | 20140063435 A | 5/2014 |
| KR | 1463416 B1 | 11/2014 |
| KR | 1626525 B1 | 6/2016 |
| KR | 1695260 B1 | 1/2017 |

(Continued)

*Primary Examiner* — Ratisha Mehta
(74) *Attorney, Agent, or Firm* — Cantor Colburn LLP

(57) ABSTRACT

An electroluminescent device, a method of manufacturing the same, and a display device including the same.

The electroluminescent device includes a first electrode, a hole transport layer disposed on the first electrode, an emission layer disposed on the hole transport layer and including light emitting particles, an electron transport layer disposed on the emission layer and including nanoparticles having electron transport capability, and a second electrode disposed on the electron transport layer, wherein at least a portion of the nanoparticles having electron transport capability include an inorganic oxide core represented by Chemical Formula 1, an organic ligand attached to a surface of the inorganic oxide core, and a metal-organic compound chemically bound to the surface of the inorganic oxide core.

$M_xO_y$  Chemical Formula 1

17 Claims, 8 Drawing Sheets

(56) References Cited

FOREIGN PATENT DOCUMENTS

| | | |
|---|---|---|
| KR | 20170117466 A | 10/2017 |
| KR | 1815773 B1 | 1/2018 |

\* cited by examiner

ELECTROLUMINESCENT DEVICE, AND DISPLAY DEVICE COMPRISING THEREOF

CROSS-REFERENCE TO RELATED APPLICATION

This application claims priority to and the benefit of Korean Patent Application No. 10-2018-0097450 filed in the Korean Intellectual Property Office on Aug. 21, 2018, and all the benefits accruing therefrom under 35 U.S.C. § 119, the entire contents of which are incorporated herein by reference.

BACKGROUND

1. Field

An electroluminescent device and a display device including the same are disclosed.

2. Description of the Related Art

Quantum dots are a nanocrystal semiconductor material having a diameter of less than or equal to about 10 nanometers (nm), which exhibit quantum confinement effects. Quantum dots generate stronger, e.g., brighter, light in a narrow wavelength region than phosphor. Quantum dots emit light while the excited electrons are transitioned from a conduction band to a valence band and wavelengths are changed depending upon a particle size even in the same material. As quantum dots with relatively smaller particle sizes emit light with relatively shorter wavelengths, light in a desirable wavelength region may be provided by adjusting the sizes of the quantum dots.

An emission layer including quantum dots and the various kinds of electronic devices including the same may save in production costs, compared to an organic light emitting diode using an emission layer including phosphorescence and/or phosphor material, and a desirable color may be emitted by changing a size of quantum dots, without a need to use other organic materials in the emission layer for emitting other colored lights.

SUMMARY

An electroluminescent device having improved device characteristics by preventing a leakage current and improving a charge carrier balance, and a display device including the same are provided.

According to an embodiment, an electroluminescent device includes a first electrode; a hole transport layer disposed on the first electrode; an emission layer disposed on the hole transport layer and including light emitting particles; an electron transport layer disposed on the emission layer and including nanoparticles having electron transport capability; and a second electrode disposed on the electron transport layer, wherein at least a portion of the nanoparticles having electron transport capability include an inorganic oxide core represented by Chemical Formula 1, an organic ligand attached to a surface of the inorganic oxide core, and a metal-organic compound chemically bound to the surface of the inorganic oxide core.

  Chemical Formula 1

In Chemical Formula 1,
M is Zn, Ti, Zr, Sn, W, or Ta, and
x and y are independently an integer ranging from 1 to 5.

A difference between lowest unoccupied molecular orbital (LUMO) energy levels of the emission layer and the electron transport layer may be greater than a difference between LUMO energy levels of the emission layer and ZnO.

A LUMO energy level of the electron transport layer may be greater than about 4.36 electronvolts (eV) and less than or equal to about 5.0 eV.

The metal-organic compound may include Zn, Mg, Al, In, Ga, or a combination thereof.

The metal of the metal-organic compound may be chemically bonded with the surface of the inorganic oxide core.

The organic ligand, the metal-organic compound, or a combination thereof may have a hydrophilic moiety.

The metal-organic compound may include a carboxylate moiety.

The carboxylate moiety may include an acetate moiety, a propionate moiety, an acrylate moiety, or a combination thereof.

The electroluminescent device may further include a carboxylate ligand that is chemically bound to the surface of the inorganic oxide core.

The inorganic oxide core may include ZnO and the metal-organic compound may include a zinc-acetate (Zn-acetate) compound.

The metal-organic compound may be present in an amount of about 1 weight percent (wt %) to about 40 wt %, based on a total amount of the nanoparticles having electron transport capability.

The electron transport layer may include a cluster layer including at least two nanoparticles.

At least a portion of the light emitting particles may include quantum dots.

At least a portion of the light emitting particles may have a core-shell structure.

The light emitting particles may include a Group II-VI compound that does not include Cd, a Group III-V compound, a Group IV-VI compound, a Group IV element or compound, a Group compound, a Group I-II-IV-VI compound that does not include Cd, or a combination thereof.

At least a portion of the light emitting particles may include a hydrophobic ligand.

According to an embodiment, a display device includes the electroluminescent device.

An electroluminescent device having device characteristics may be provided.

As described above, a display device including an electroluminescent device having improved device characteristics may be provided.

DETAILED DESCRIPTION

Figure 1:
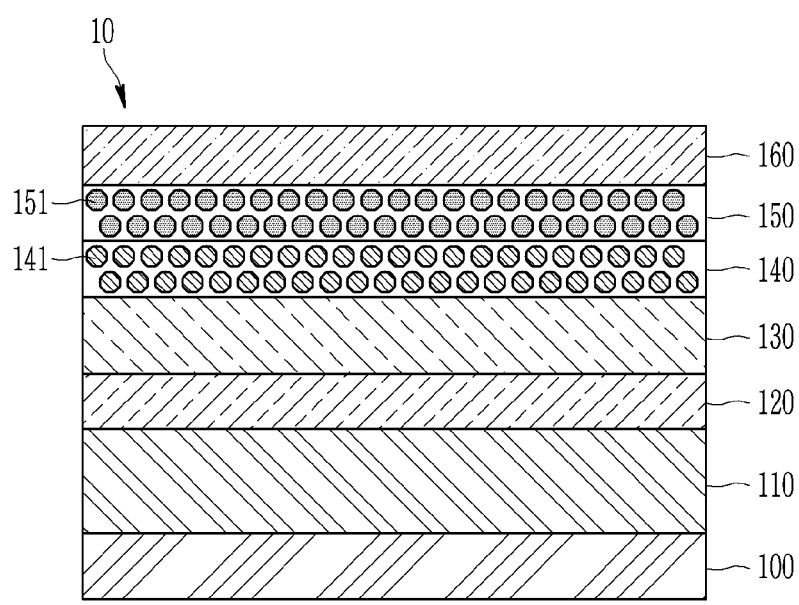
FIG. 1 is a schematic cross-sectional view showing an electroluminescent device according to an embodiment, FIG. 2 schematically shows nanoparticles having electron transport capability in an electroluminescent device according to an embodiment, FIG. 3 schematically shows nanoparticles having electron transport capability in an electroluminescent device according to a modified embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "beneath," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as "beneath" other elements would then be oriented "above" the other elements. The exemplary term "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example Zn, Hg, Mg, etc.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

In an embodiment, for a particle diameter of a particle in the present disclosure, although the particle diameter may be quantified by a measurement to provide an average size of a group, the method may include a mode diameter providing the maximum value of the distribution, a median diameter corresponding to the center value of integral distribution curve, a variety of average diameters (numeral average, length average, area average, mass average, volume average, etc.), and the like. Unless particularly mentioned otherwise, an average particle diameter means a numeral average diameter in the present disclosure, and the average particle diameter is obtained by measuring D50 (particle diameter at a position of distribution rate of 50%).

The luminous efficiency of an emission layer including quantum dots is determined by quantum efficiency of the quantum dots, a balance of charge carriers, light extraction efficiency, a leakage current, and the like. In order to improve luminous efficiency of an emission layer, excitons may be controlled to be confined in an emission layer, holes and electrons of a quantum dot may be transported, e.g., relatively smoothly, or leakage current may be prevented.

FIG. 1 is a schematic cross-sectional view showing an electroluminescent device according to an embodiment.

An electroluminescent device 10 according to an embodiment includes a first electrode 110, a hole transport layer 130 disposed on the first electrode 110, a hole injection layer 120 disposed between the first electrode 110 and the hole transport layer 130 and may be omitted considering a relationship with each constituent element, an emission layer 140 disposed on the hole transport layer 130 and including light emitting particles 141, an electron transport layer 150 disposed on the emission layer 140 and nanoparticles 151 having electron transport capability, and a second electrode 160 disposed on the electron transport layer 150.

The electroluminescent device 10 has a stack structure in which the hole injection layer 120, the hole transport layer 130, the emission layer 140 and the electron transport layer 150 are disposed between the first electrode 110 and the second electrode 160 facing each other.

The electroluminescent device 10 according to an embodiment supplies current to the emission layer 140 through the first electrode 110 and the second electrode 160, and causes electroluminescence of the light emitting particles 141 to generate light. The electroluminescent device 10 may generate light in various wavelength regions according to materials, sizes, or fine, e.g., crystal, structures of the light emitting particles 141 of the emission layer 140.

In an embodiment, the first electrode 110 may be directly connected to a driving power source so may function to flow current to the emission layer 140. The first electrode 110 may include a material having light transmittance in at least a visible light wavelength region, but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The first electrode 110 according to an embodiment is not necessarily limited thereto but may include a material further having light transmittance with respect to light in an infrared or ultraviolet (UV) wavelength region or a semi-permeable material selectively transmitting light in a particular wavelength region and conduct a function of reflecting light in a visible light wavelength region and directing the light in the visible light wavelength region back toward the first electrode 110.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate 100 may include a COC (cyclo olefin copolymer) or COP (cyclo olefin polymer) based material.

In an embodiment, the substrate 100 may support the hole injection layer 120, the transport layer 130, the emission layer 140, and the electron transport layer 150 disposed between the first electrode 110 and the second electrode 160. The substrate 100 of the electroluminescent device 10 according to an embodiment may not be disposed under the first electrode 110, but the substrate 100 may be disposed on the second electrode 160 or may be omitted, as desired.

The second electrode 160 includes an optically transparent material and may function as a light-transmitting electrode to transmit light generated in the emission layer 140. In an embodiment, the second electrode 160 may include silver (Ag), aluminum (Al), copper (Cu), gold (Au), or an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The second electrode 160 according to an embodiment is not necessarily limited thereto but may include a semi-permeable material selectively transmitting light in a particular wavelength region, and conduct a function of reflecting light in a visible light wavelength region and directing the light in the visible light wavelength back toward the first electrode 110.

When the second electrode 160 functions as a reflecting electrode, the first electrode 110 may be a light-transmitting electrode formed of a material transmitting light in at least visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

As shown in FIG. 1, an electroluminescent device 10 according to an embodiment may have a structure in which the substrate 100 and each of the constituent elements of the substrate 100 are disposed in the above described stacked order.

The electroluminescent device 10 according to an embodiment is not necessarily limited thereto but may have various structures within a range of satisfying the aforementioned order of disposing each constituent element. For example, when the substrate 100 is disposed not beneath the first electrode 110 but on the second electrode 160, the electroluminescent device 10 may have an inverted structure.

The hole injection layer 120 may be disposed directly on the first electrode 110. The hole injection layer 120 may supply holes into the emission layer 140 together with the hole transport layer 130. The hole injection layer 120 may be omitted considering the thickness and the material of the hole transport layer 130.

The hole injection layer 120 may be formed of a p-type semiconductor material or a material doped with a p-type dopant. For example, the hole injection layer 120 may include a PEDOT [poly(3,4-ethylenedioxythiophene)] derivative, a PSS [poly(styrene sulfonate)] derivative, a poly-N-vinylcarbazole (PVK) derivative, a polyphenylenevinylene derivative, a poly p-phenylene vinylene (PPV) derivative, a polymethacrylate derivative, a poly(9,9-octyl-fluorene) derivative, a poly(spiro-fluorene) derivative, TCTA (tris(4-carbazol-9-yl phenyl)amine), TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly(9,9'-dioctylfluorene-co-N-(4-butylphenyl)diphenylamine)), PFB (poly(9,9-dioctylfluorene)-co-N,N-diphenyl-N,N-di-(p-butylphenyl)-1,4-diaminobenzene), poly-TPD, a metal oxide such as NiO and $MoO_3$, or a combination thereof, but is not limited thereto.

The hole transport layer 130 may be disposed on the first electrode 110, for example on the first electrode 110 and the hole injection layer 120. The hole transport layer 130 may provide and transport holes into the emission layer 140. The hole transport layer 130 may be formed directly under the emission layer 140 and directly contact the emission layer 140.

In an embodiment, the hole transport layer 130 may be formed of a p-type semiconductor material or a material doped with a p-type dopant. For example, the hole transport layer 130 may include a PEDOT [poly (3,4-ethylenedioxythiophene)] derivative, a PSS [poly(styrene sulfonate)] derivative, a poly-N-vinylcarbazole (PVK) derivative, a polyphenylenevinylene derivative, a poly p-phenylene vinylene (PPV) derivative, a polymethacrylate derivative, a poly(9,9-octylfluorene) derivative, a poly(spiro-fluorene) derivative, TCTA (tris(4-carbazol-9-yl phenyl)amine), TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly(9,9'-dioctylfluorene-co-N-(4-butylphenyl)diphenylamine)), PFB (poly(9,9-dioctylfluorene)-co-N,N-diphenyl-N,N-di-(p-butylphenyl)-1,4-diaminobenzene), poly-TPD, a metal oxide such as NiO and $MoO_3$, or a combination thereof, like the hole injection layer 120, but is not limited thereto.

This hole transport layer 130 increases a life-span of a luminescent device and decreases a turn-on voltage at which the electroluminescent device 10 starts to work. For example, the hole transport layer 130 formed of a polymer material such as PEDOT:PSS, PPV, PVK, TCTA, TPD, NPB, MTDATA, TFB, PFB, poly-TPD, and the like may have relatively strong resistance characteristics against a material that may cause degradation such as oxygen, moisture, or the like compared with a low molecular organic material and high resistance about crystallization.

The hole transport layer 130 may be formed in a wet coating method such as spin coating and the like. In this way, the hole transport layer 130 may be formed on the emission layer 140 in a simple method. When the emission layer 140 has hydrophobicity, a polar solvent may be selected as a solvent used for forming the hole transport layer 130 so that damage of the hole transport layer 130 may be minimized during a subsequent forming process of the emission layer 140.

For example, a polymer film such as PEDOT:PSS, and the like may be obtained by spin coating a precursor solution including a PEDOT:PSS precursor polymer and a polar solvent (e.g., water, methanol, ethanol, ethylene glycol, etc.) on the first electrode 110 or the hole injection layer 120, heat-treating it, for example, under an inert gas atmosphere of $N_2$ or vacuum at a curing temperature of about 250° C. to about 300° C. to manufacture the hole transport layer 130 including, e.g., consisting of, PEDOT:PSS, and forming the emission layer 140 having hydrophobicity by a solution process, e.g., forming the emission layer 140 having hydrophobicity by a solution process relatively easily.

The emission layer 140 may be formed on the hole transport layer 130 and may include light emitting particles.

The emission layer 140 is a site where electrons and holes transported by a current supplied from the first electrode 110 and the second electrode 160, the electrons and holes are combined in the emission layer 140 to generate excitons, and the generated excitons are transitioned from an exited state to a ground state to emit light in a wavelength corresponding to the size of the light emitting particles 141.

The emission layer 140 may emit light in a predetermined wavelength region. The predetermined wavelength region belongs to a visible light region, for example, one among a first wavelength region of about 380 nm to about 488 nm, a second wavelength region of about 490 nm to about 510 nm, a third wavelength region of about 511 nm to about 580 nm, a fourth wavelength region of about 582 nm to about 600 nm, and a fifth wavelength region of about 620 nm to about 680 nm.

In an embodiment, the light emitting particles 141 may include quantum dots. That is, the light emitting particles 141 may consist of quantum dots, or a portion of the light emitting particles 141 may include, e.g., consist of, quantum dots and another portion of the light emitting particles 141 may include, e.g., consist of, light emitting elements, for example commercially available phosphors that are separate, e.g., different or distinct, from quantum dots.

The quantum dots have a discontinuous energy bandgap due to, for example, the quantum confinement effect exhibited by the quantum dots and incident light may be converted into light having a particular wavelength and then radiated. When the light emitting particles 141 consists of quantum dots, the emission layer 140 may produce light having improved color reproducibility and color purity.

In an embodiment, materials of the quantum dots are not particularly limited and commercially available quantum dots may be used. For example, each of light emitting particles 141 according to an embodiment may include a Group II-VI compound that does not include Cd, a Group III-V compound, a Group IV-VI compound, a Group IV element or compound, a Group compound, a Group I-II-IV-VI compound that does not include Cd, or a combination thereof. That is, each of light emitting particles 141 according to an embodiment may be a non-cadmium-based quantum dot. When the light emitting particles 141 are quantum dots including, e.g., consisting of, a non-cadmium-based material, the light emitting particles 141 have reduced or minimal toxicity compared with a cadmium-based quantum dot and thus the non-cadmium-based quantum dots are less dangerous and are relatively environmentally-friendly.

The Group II-VI compound may be a binary element compound of ZnS, ZnSe, ZnTe, ZnO, HgS, HgSe, HgTe, MgSe, MgS, or a combination thereof; a ternary element compound of ZnSeS, ZnSeTe, ZnSTe, HgSeS, HgSeTe, HgSTe, HgZnS, HgZnSe, HgZnTe, MgZnSe, MgZnS, or a combination thereof; or a quaternary element compound of ZnSeSTe, HgZnTeS, HgZnSeS, HgZnSeTe, HgZnSTe, or a combination thereof. The Group II-VI compound may further include a Group III metal.

The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (InZnP).

The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be a single substance of Si, Ge, or a combination thereof; or a binary element compound of SiC, SiGe, or a combination thereof.

The binary element compound, the ternary element compound, or the quaternary element compound respectively exists in a uniform concentration in the particle or in partially different, e.g., varying, concentrations in the same particle.

According to an embodiment, the quantum dots may have a core-shell structure including one semiconductor nanocrystal core and another semiconductor nanocrystal shell surrounding the core. The core and the shell may have a concentration gradient in which the concentration of the element(s) of the shell decreases toward the core. In addition, the quantum dots may have one semiconductor nanocrystal core and multiple shells, e.g., a multi-layered shell structure, surrounding the core. The multi-layered shell structure has a structure of two or more shells and each layer may have a single composition or an alloy or may have a concentration gradient.

In an embodiment, the light emitting particles may have a core-shell structure. When the light emitting particles has a core-shell structure, a material composition of the shell has a larger energy bandgap than that of the core, which may exhibit an effective quantum confinement effect. The embodiment is not limited thereto. In the multi-layered shell, a shell that is outside of the core has may have a higher energy bandgap than a shell that is near to the core and quantum dots may have an ultraviolet (UV) to infrared wavelength ranges.

The quantum dots may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dots may have a relatively narrow spectrum so as to improve color purity or color reproducibility. The quantum dots may have for example a full width at half maximum (FWHM) of a photoluminescence wavelength spectrum of less than or equal to about 45 nm, less than or equal to about 40 nm, or less than or equal to or about 30 nm. Within the ranges, color purity or color reproducibility of a device may be improved.

The quantum dots may have a particle diameter (the longest diameter for a non-spherically shaped particle) of about 1 nm to about 100 nm. For example, the quantum dots may have a particle diameter of about 1 nm to about 20 nm, for example, about 2 nm (or about 3 nm) to about 15 nm.

In addition, the shapes of the quantum dots may not be particularly limited. For example, the quantum dots may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dots may have a suitable cross-sectional shape.

The quantum dots may be commercially available or may be synthesized in a suitable method. For example, several nano-sized quantum dots may be synthesized according to a wet chemical process. In the wet chemical process, precursors react in an organic solvent to grow crystal particles, and the organic solvent or a ligand compound may coordinate with, e.g., bind to, the surface of the quantum dot, controlling the growth of the crystal. The organic solvent coordinated on the surface of the quantum dots may affect stability of a device, and thus excess organic materials that are not coordinated on the surface of the nanocrystals may be removed by pouring the organic solvent in excess nonsolvent, and centrifuging the resulting mixture. Examples of the non-solvent may be acetone, ethanol, methanol, and the like, but are not limited thereto. After the removal of excess organic materials, the amount of the organic materials coordinated on the surface of the quantum dots may be less than or equal to about 50 weight percent (wt %), for example, less than or equal to about 30 wt %, less than or equal to about 20 wt %, or less than or equal to about 10 wt %, based on a weight of the quantum dots. The organic material may include a ligand compound, an organic solvent, or a combination thereof.

The quantum dots may have for example a ligand having a hydrophobic moiety bound to its surface. In an embodiment, the ligand having the hydrophobic moiety may be RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 alkyl group, a C5 to C24 alkenyl group, a C5 to C20 alicyclic group, or a C5 to C20 aryl group), a polymeric organic ligand, or a combination thereof. The ligand may be an organic ligand of a monofunctional group and the functional group may be bound to the surface of the quantum dots.

When the quantum dots have a ligand having a hydrophobic moiety, the light emitting particles according to an embodiment may be overly hydrophobic due to attachment of the ligand to the quantum dots. In this way, when the light emitting particles include the quantum dots and the hydrophobic ligand, an emission layer also becomes hydrophobic.

In this way, when an electron transport layer (in a case of a comparative device structure) or an electron transport layer (in a case of an inverted device structure) is formed on the emission layer 140 in a solution process by selecting a ligand in consideration of properties of the hole transport layer 130, the electron transport layer 150, and the ligand bound to a quantum dot, the emission layer 140 may be prevented from damage due to a solvent.

An embodiment is not necessarily limited thereto, but a different kind of ligand (a ligand having a hydrophilic moiety or a ligand having a hydrophobic moiety) may be selected to be attached to a quantum dot by considering hydrophilicity/hydrophobicity of the hole transport layer 130 contacting the emission layer 140 and the electron transport layer 150, or a suitable kind of ligand may be attached to the quantum dot when a method of deposition and the like is adopted to form a layer on the emission layer 140, rather than the solution process.

In an embodiment, the electron transport layer 150 is disposed between the emission layer 140 and the second electrode 160 and thus transports electrons into the emission layer 140.

In an embodiment, a thickness of the electron transport layer 150 may be variously changed considering charge carrier balance of the hole injection layer 120, the hole transport layer 130, and/or the emission layer 140 in the device, but may be for example greater than or equal to about 20 nm, greater than or equal to about 25 nm, greater than or equal to about 30 nm, greater than or equal to about 35 nm, or greater than or equal to about 40 nm, and for example less than or equal to about 100 nm, less than or equal to about 90 nm, less than or equal to about 80 nm, less than or equal to about 70 nm, less than or equal to about 60 nm, less than or equal to about 55 nm, or less than or equal to about 50 nm, for example about 20 nm to about 100 nm, about 30 nm to about 80 nm, or about 40 nm to about 60 nm.

When the electron transport layer 150 has a thickness of less than about 20 nm, voids, cracks, and the like of the electron transport layer 150 may have a relatively large effect on electron transport capability and decrease device characteristics, and it may be difficult to meet a carrier balance with other constituent elements of the electroluminescent device.

When the thickness of the electron transport layer 150 is greater than 100 nm, the emission layer 140 is supplied with electrons relatively fast and/or in a relatively large amount compared with holes, the electrons may meet the holes on the interface of the emission layer 140 and the hole transport layer 130 and thus emit light on the interface or move toward the hole injection layer 120 and/or the hole transport layer 150 and thus be quenched.

In an embodiment, the electron transport layer 150 may include, e.g., consist of, non-light-emitting electron transport materials that do not emit light by an electric field so that electrons may not be quenched internally.

In an embodiment, the electron transport layer 150 includes nanoparticles 151 having electron transport capability. The nanoparticles 151 impart the electron transport layer 150 with electron transport capability and may not have light emitting properties. In an embodiment, the electron transport layer 150 may include two or more nanoparticles 151. In an embodiment, the electron transport layer 150 may include a cluster layer including two or more, e.g., consisting of, nanoparticles 151.

Figure 2:
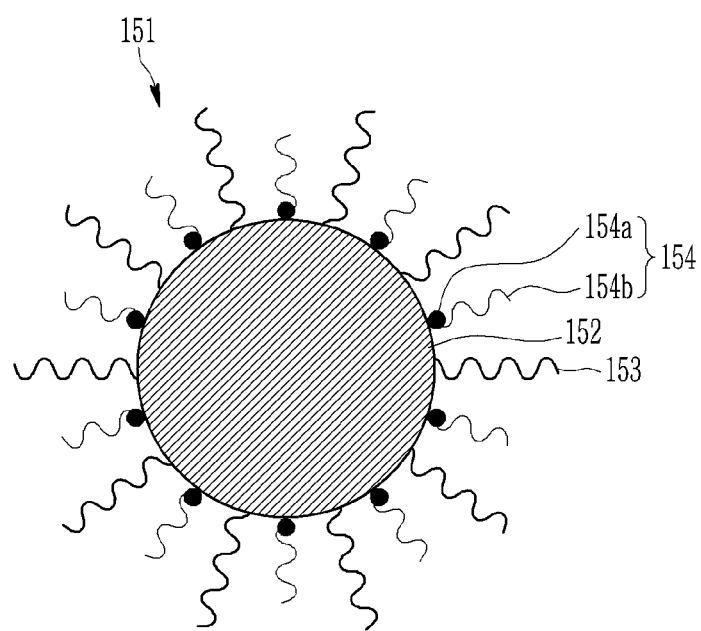

FIG. 2 schematically shows nanoparticles having electron transport capability in an electroluminescent device according to an embodiment.

Referring to FIG. 2, the nanoparticles 151 include an inorganic oxide core 152, an organic ligand 153 attached to the surface of the inorganic oxide core 152, and a metal-organic compound 154 chemically bound to the surface of inorganic oxide core 152.

In an embodiment, the inorganic oxide core 152 may include an inorganic oxide having electron transport capability. Thereby, the nanoparticles 151 may exhibit electron transport capability. For example, the inorganic oxide core 152 may be represented by Chemical Formula 1.

  Chemical Formula 1

In Chemical Formula 1, M is Zn, Ti, Zr, Sn, W, or Ta, x and y are independently an integer ranging from 1 to 5.

In an embodiment, the inorganic oxide core 152 represented by Chemical Formula 1 may be partially relatively weakly positively and/or negatively charged in each M and O site but electrically neutral overall.

Examples of the inorganic oxide core 152 represented by Chemical Formula 1 may include ZnO, $TiO_2$, $ZrO_2$, $SnO_2$, $WO_3$, $Ta_2O_3$, and the like, but is not limited thereto.

In an embodiment, the inorganic oxide core 152 may include, e.g., consist of, ZnO. When the inorganic oxide core 152 includes, e.g., consists of, ZnO, the nanoparticles 151 including the same may exhibit improved electron transport capability.

In an embodiment, the organic ligand 153 is attached to the surface of the inorganic oxide core 152. In an embodiment, the organic ligand 153 may have different properties from those of the ligand attached to the quantum dot. For example, when the ligand attached to the quantum dot has a hydrophobic moiety, the organic ligand 153 may have a hydrophilic moiety as described above. In this way, since the ligand attached to a quantum dot and the organic ligand 153 attached to an inorganic oxide core have different properties, the emission layer 140 may be minimized from damage by a solvent in the composition for an electron transport layer, even though the electron transport layer 150 is formed on the emission layer 140 by using a solution process.

In an embodiment, examples of the organic ligand 153 having hydrophilicity may be an acetate, an acrylate, a propionate, a methoxy, an ethoxy, a butoxy, a derivative thereof, or a combination thereof.

In an embodiment, the metal-organic compound 154 is chemically bound to the surface of the inorganic oxide core 152. In this way, when the metal-organic compound 154 is chemically bound to the inorganic oxide core 152, the nanoparticles 151 exhibit changed electron transport capability unlike when a metal-organic compound is physically adsorbed in and/or attached to an inorganic oxide core.

For example, when the metal-organic compound 154 is chemically bound to the surface of the inorganic oxide core 152 as in an embodiment, electron mobility is decreased compared with when only an inorganic oxide core is present without a metal-organic compound. Accordingly, when nanoparticles 151 having the metal-organic compound 154 chemically bound to the surface of the inorganic oxide core 152 are used, hole and electron carriers may be balanced, e.g., relatively easily, in the electroluminescent device 10.

In an embodiment, a LUMO energy level difference between the emission layer 140 and the electron transport layer 150 may be adjusted to be greater than a LUMO energy level difference between the emission layer 140 and an electron transport layer having only an inorganic oxide core (e.g., a ZnO inorganic oxide core).

Accordingly, the electron transport layer 150 may exhibit a lower LUMO energy level than an electron transport layer having only an inorganic oxide core. For example, the LUMO energy level of the electron transport layer 150 may be in a range of greater than about 4.36 eV, greater than or equal to about 4.37 eV, less than or equal to about 5.0 eV, less than or equal to about 4.9 eV, less than or equal to about 4.8 eV, or less than or equal to about 4.7 eV, for example, greater than about 4.36 eV and less than or equal to about 5.0 eV.

The LUMO energy level of the electron transport layer 150 may be measured by using X-ray photoelectron spectroscopy (XPS) and for example, a Versaprobe surface analysis instrument (PH15000, Ulvac-Phi Inc.).

The LUMO energy level of the electron transport layer 150 may have a small error depending on a measurement method and/or a measuring instrument but satisfy the above ranges, when measured by using the above measurement method and the measuring instrument. Accordingly, when an electron transport layer satisfies the above LUMO energy level ranges by using the above measurement method and the measuring instrument, the above LUMO energy level range belongs to the range of the present disclosure.

A metal 154a included in the metal-organic compound 154 may be selected, e.g., from a particular metal group, such that the metal 154a or metal-organic compound 154 does not deteriorate, e.g., decrease, an electron transport capability of the inorganic oxide core 152. The metal 154a included in the metal-organic compound 154 may be Zn, Mg, Al, In, Ga, or a combination thereof.

In an embodiment, the metal 154a included in the metal-organic compound 154 may include the same kind of metal as a metal included in the inorganic oxide core 152. For example, the inorganic oxide core 152 may include, e.g., consist of, ZnO, and the metal-organic compound 154 may include Zn.

An embodiment is not necessarily limited thereto, but the metal 154a included in the metal-organic compound 154 may further include a different kind of metal from the metal included in the inorganic oxide core 152, or may include, e.g., consist of, a different kind of metal from the metal included in the inorganic oxide core 152.

In an embodiment, the metal 154a of the metal-organic compound 154 may form a chemical bond with the inorganic oxide core 152. For example, the metal 154a included in the metal-organic compound 154 may have a chemical bond with an oxygen atom inside the inorganic oxide core 152.

Particles including, e.g., consisting of, an inorganic oxide may have a bond with an internal metal and an oxygen atom, for example, when an inorganic oxide core includes, e.g., consists of, ZnO, a chemical structure such as —(Zn—O)— is repeated in the surface of the ZnO core. The metal 154a included in the metal-organic compound 154 according to an embodiment may form an ionic bond, a covalent bond, and a mixed bond of the ionic bond and the covalent bond with the oxygen atom in the —(Zn—O)— chemical structure.

In this way, when the metal-organic compound 154 has a chemical bond with the inorganic oxide core 152 through the metal 154a, an energy level of the inorganic oxide core 152 may not only be adjusted, but also a defect on the surface of the inorganic oxide core 152 may be removed through the chemical bond.

In an embodiment, the metal-organic compound 154 and the organic ligand 153, or a combination thereof may have a hydrophilic moiety. For example, even when the organic ligand 153 has a hydrophobic moiety, the metal-organic compound 154 may have a hydrophilic moiety. In an embodiment, a moiety corresponding to the organic compound 154b in the metal-organic compound 154 may have a hydrophilic moiety.

The hydrophilic moiety may include a carboxylate moiety. In an embodiment, the carboxylate moiety may include an acetate moiety, a propionate moiety, an acrylate moiety, or a combination thereof.

The carboxylate moiety may form an ionic bond with a metal but may provide the metal-organic compound 154 with hydrophilicity by binding the metal moiety with the surface of the inorganic oxide core 152. In addition, an energy level of the nanoparticles 151 may be adjusted by controlling an amount of the carboxylate moiety included in the nanoparticles 151. For example, the carboxylate moiety may decrease a LUMO energy level of the inorganic oxide core 152 as described above. Accordingly, electron/hole carriers in the electroluminescent device 10 may be internally balanced by increasing an energy barrier against holes moving from the emission layer 140 toward the electron transport layer 150.

In an embodiment, the inorganic oxide core includes, e.g., consists of, ZnO, and the metal-organic compound may include a zinc-acetate (Zn-acetate) compound. For example, the metal-organic compound may be a zinc-acetate (Zn-acetate) compound.

Figure 3:
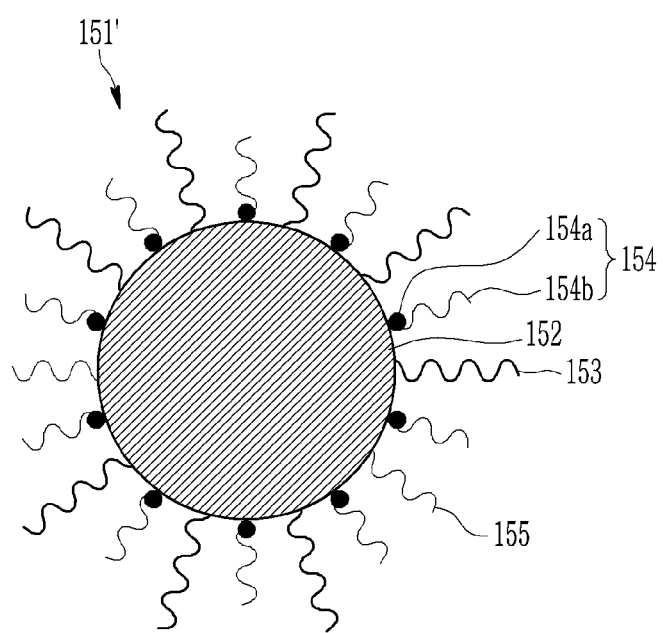

FIG. 3 schematically shows nanoparticles having electron transport capability in an electroluminescent device according to a modified embodiment.

Referring to FIG. 3, nanoparticles 151' according to a modified embodiment may further include a carboxylate ligand 155 in addition to the organic ligand 153 attached on the surface of the inorganic oxide core 152 and the metal-organic compound 154.

The carboxylate ligand 155 may be attached to the surface of the inorganic oxide core 152. The carboxylate ligand 155 may work as a ligand of the nanoparticles 151' like the organic ligand 153.

In a modified embodiment, the carboxylate ligand 155 may have a chemical bond with the inorganic oxide core 152. For example, an oxygen moiety of the carboxylate ligand 155 may have a chemical bond with a metal inside the inorganic oxide core 152.

In the modified embodiment, the carboxylate ligand 155 may be derived from a carboxylate moiety included in the metal-organic compound 154. For example, the carboxylate ligand 155 may be formed through a chemical bond of a part of carboxylate anions ionized during a process of attaching the metal-organic compound 154 to the inorganic oxide core 152 with the surface of the inorganic oxide core 152.

In this way, since the carboxylate ligand 155 is further attached to the nanoparticles 151' during the process of chemically bonding the metal-organic compound 154 with the nanoparticles 151' in the modified embodiment, surface defects of the nanoparticles 151' may be further reduced.

In an embodiment, the metal-organic compound may be for example included in an amount of greater than or equal to about 1 wt %, for example greater than or equal to about 1.5 wt %, greater than or equal to about 1.7 wt %, greater than or equal to about 2 wt %, greater than or equal to about 5 wt %, greater than or equal to about 7 wt %, or greater than or equal to about 10 wt % and for example less than or equal to about 40 wt %, less than or equal to about 35 wt %, or less than or equal to about 30 wt %, for example about 1 wt % to about 40 wt %, based on a total amount of the nanoparticles having electron transport capability.

When the metal-organic compound 154 is used in an amount of less than about 1 wt %, based on the total amount of the nanoparticles having electron transport capability, the metal-organic compound 154 is insufficiently bound to the inorganic oxide core 152, and thus the surface defects of the inorganic oxide core 152 may hardly, e.g., barely, be minimized, and an energy level of the nanoparticles 151 may hardly, e.g., minimally, be adjusted.

When the metal-organic compound 154 is used in an amount of about 40 wt %, based on the total amount of the nanoparticles having electron transport capability, electron transport capability of the inorganic oxide core 152 may be deteriorated, e.g., relatively greatly, by the metal-organic compound 154.

ZnO as a material for an electron transport layer exhibits high efficiency, only when used with a quantum dot including Cd. When ZnO is used as a material for an electron transport layer with a quantum dot not including Cd, ZnO exhibits relatively fast mobility in the electron transport layer compared with an emission layer or other auxiliary layers (a hole transport layer, a hole injection layer, and the like), and accordingly, charge carriers may desirably to be balanced over an electroluminescent device in consideration of an energy level or mobility among constituent elements.

ZnO has surface defects, and thus holes transported to the emission layer 140 may move to the electron transport layer 150 through the surface defects of ZnO. The surface defects of ZnO may work as a hole leakage path, and holes entered inside the electron transport layer 150 may not return to the emission layer 140 but be quenched.

The metal-organic compound 154 according to an embodiment is chemically bound to the surface of the inorganic oxide core 152 as described above, and thus the surface defects of the inorganic oxide core 152 along with the organic ligand 153 may be minimized. Accordingly, the electroluminescent device 10 according to an embodiment may have the electron transport layer 150 formed by using the nanoparticles 151 having minimized surface defects. The electroluminescent device 10 may have improved efficiency according to an embodiment.

An electron injection layer easing injection of electrons and/or a hole blocking layer blocking movement of holes may be further disposed between the electron transport layer 150 and the second electrode 160.

The electron injection layer and the hole blocking layer may have each desirably selected thickness. For example, each thickness may be in a range of greater than or equal to about 1 nm and less than or equal to about 500 nm but is not limited thereto. The electron injection layer may be an organic layer formed through deposition.

The electron injection layer may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), 4,7-Diphenyl-1, 10-phenanthroline (Bphen), ABH113, NET218, NET338, NET430, NDN77, NDN87, or a combination thereof, but is not limited thereto.

The hole blocking layer may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

The electron injection layer and/or the hole blocking layer may be omitted in consideration of a thickness, a material, and the like of the electron transport layer 150.

In this way, the electroluminescent device 10 according to an embodiment may improve device efficiency by using the nanoparticles 151 including the metal-organic compound 154 to form the electron transport layer 150 and blocking an internal hole leakage path and in addition, balance, e.g., relatively easily, charge carriers of the electron transport layer 150 by using the metal-organic compound 154.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 but the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. The first to third electroluminescent devices may be pixels expressing red, green, and blue, respectively, in the display device.

An embodiment is not necessarily limited thereto, but the first to third electroluminescent devices may respectively express magenta, yellow, cyan, or may express other colors.

One of the first to third electroluminescent devices may be the electroluminescent device 10. In this case, the third electroluminescent device displaying at least blue may be desirably the electroluminescent device 10.

In the display device according to an embodiment, a hole injection layer, a hole transport layer, an electron transport layer, an electron injection layer, and a hole blocking layer except an emission layer of each pixel may be integrated to form a common layer. An embodiment is not limited thereto. A hole injection layer, a hole transport layer, an electron transport layer, an electron injection layer, and a hole blocking layer may be independently formed in each pixel of the display device, or a hole injection layer, a hole transport layer, an electron transport layer, an electron injection layer, a hole blocking layer, or a combination thereof may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, the substrate may include a COC (cycloolefin copolymer) or COP (cycloolefin polymer) based material. All the first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one line, for example, a scan line, a data line, a driving power source line, a common power source line, and the like, at least two of thin film transistors (TFT) connected to the wire and corresponding to one organic light emitting diode, and at least one capacitor, or the like. The driving circuit may have a variety of structures.

As described above, a display device according to an embodiment may exhibit improved device efficiency and thus improved photoluminescence characteristics.

Hereinafter, the embodiments are illustrated in more detail with reference to examples. However, these examples are exemplary, and the present disclosure is not limited thereto.

Synthesis Example 1

3 millimoles (mmol) of zinc acetate dihydrate is dissolved in 30 milliliters (mL) of dimethylsulfoxide in a reactor, and then, a solution prepared by dissolving 5.5 mmol of tetramethylammonium hydroxide pentahydrate (TMAH) in 10 mL of ethanol is added to the reactor. After stirring the mixture for 1 hour, ZnO powder (a ZnO core) obtained therefrom is dispersed in 10 mL of ethanol. Subsequently, 0.03 mmol of zinc acetate is added to the ZnO powder-containing ethanol, and the obtained mixture is stirred at room temperature to chemically bind zinc acetate with the ZnO core and thus prepare a solution for an electron transport layer in which nanoparticles (an average particle diameter=3.7 nanometers (nm), an amount of the zinc acetate, based on the total amount of the nanoparticles=1.7 weight percent (wt %)) are dispersed.

Synthesis Example 2

A solution for an electron transport layer according to Synthesis Example 2 is prepared according to the same method as Synthesis Example 1 except for adjusting the amount of the zinc acetate into 7 wt %, based on the total amount of the nanoparticles.

Synthesis Example 3

A solution for an electron transport layer according to Synthesis Example 3 is prepared according to the same method as Synthesis Example 1 except for adjusting the amount of the zinc acetate into 5 wt %, based on the total amount of the nanoparticles.

Synthesis Example 4

A solution for an electron transport layer according to Synthesis Example 4 is prepared according to the same method as Synthesis Example 1 except for adjusting the amount of the zinc acetate into 10 wt %, based on the total amount of the nanoparticles.

Synthesis Example 5

A solution for an electron transport layer according to Synthesis Example 5 is prepared according to the same method as Synthesis Example 1 except for adjusting the amount of the zinc acetate into 20 wt %, based on the total amount of the nanoparticles.

Synthesis Example 6

A solution for an electron transport layer according to Synthesis Example 6 is prepared according to the same method as Synthesis Example 1 except for adjusting the amount of the zinc acetate into 40 wt %, based on the total amount of the nanoparticles.

Comparative Synthesis Example 3 mmol of zinc acetate dihydrate is dissolved in 30 mL of dimethylsulfoxide in a reactor, a solution prepared by dissolving 5.5 mmol of tetramethyl ammonium hydroxide pentahydrate (TMAH) in 10 mL of ethanol is added to the reactor, and the mixture is stirred for one hour to obtain ZnO nanoparticles (an average particle diameter=3.7 nm). The obtained ZnO nanoparticles are dispersed in ethanol to prepare a solution for an electron transport layer according to Comparative Synthesis Example.

Example 1

A glass substrate deposited with a first electrode (an anode) of indium tin oxide (ITO) (work function (WF): 4.8 electronvolts (eV)) is surface-treated with a ultraviolet (UV)-ozone for 15 minutes, spin-coated with a poly[(9,9-dioctylfluorenyl-2,7-diyl-co(4,4'-(N-4-butylphenyl)diphenylamine] solution (TFB) (Sumitomo), and heat-treated at 150° C. for 30 minutes to form a 25 nm-thick hole injection layer (highest occupied molecular orbital (HOMO): 5.6 eV, lowest unoccupied molecular orbital (LUMO): 2.69 eV).

On the hole injection layer, a PEDOT:PSS solution (H. C. Starks) is spin-coated and heat-treated at 150° C. under an air atmosphere for 10 minutes and then, at 150° C. under an $N_2$ atmosphere for 10 minutes to form a 25 nm-thick hole transport layer.

Subsequently, a composition for an emission layer, in which blue quantum dots having an oleate-based ligand as a hydrophobic ligand attached thereto (directly manufactured) and a binder are dispersed, is coated and heated at 80° C. to form a 25 nm-thick blue emission layer (HOMO: 5.7 eV, LUMO: 3.0 eV).

On the blue emission layer, the solution for an electron transport layer according to Synthesis Example 3 is spin-coated and heat-treated at 80° C. for 30 minutes to form a 45 m-thick electron transport layer (HOMO: 7.9 eV, LUMO: 4.4 eV). On the electron auxiliary layer, aluminum (Al) is vacuum-deposited to be 90 nm thick and thus form a second electrode and accordingly, manufacture an electroluminescent device according to Example 1.

Example 2

An electroluminescent device according to Example 2 is manufactured according to the same method as Example 1 except for forming an electron transport layer (HOMO: 8.0 eV, LUMO: 4.5 eV) by using the solution for an electron transport layer according to Synthesis Example 4 instead of the solution for an electron transport layer according to Synthesis Example 3.

Example 3

An electroluminescent device according to Example 3 is manufactured according to the same method as Example 1 except for forming an electron transport layer (HOMO: 8.3 eV, LUMO: 4.8 eV) by using the solution for an electron transport layer according to Synthesis Example 5 instead of the solution for an electron transport layer according to Synthesis Example 3.

Example 4

An electroluminescent device according to Example 4 is manufactured according to the same method as Example 1 except for forming an electron transport layer (HOMO: 8.5 eV, LUMO: 5.0 eV) by using the solution for an electron transport layer according to Synthesis Example 6 instead of the solution for an electron transport layer according to Synthesis Example 3.

Example 5

An electroluminescent device according to Example 5 is manufactured according to the same method as Example 1 except for coating the composition for an emission layer in which red quantum dots having an oleate-based ligand as a hydrophobic ligand attached thereto (directly manufactured) and a binder are dispersed, and heating the composition at 80° C. to form a 25 nm-thick red emission layer (HOMO: 5.6 eV, LUMO: 3.6 eV).

Example 6

An electroluminescent device according to Example 6 is manufactured according to the same method as Example 5 except for forming an electron transport layer (HOMO: 8.0 eV, LUMO: 4.5 eV) by using the solution for an electron transport layer according to Synthesis Example 4 instead of the solution for an electron transport layer according to Synthesis Example 3.

Example 7

An electroluminescent device according to Example 7 is manufactured according to the same method as Example 5 except for forming an electron transport layer (HOMO: 8.3 eV, LUMO: 4.8 eV) by using the solution for an electron transport layer according to Synthesis Example 5 instead of the solution for an electron transport layer according to Synthesis Example 3.

Example 8

An electroluminescent device according to Example 8 is manufactured according to the same method as Example 5 except for forming an electron transport layer (HOMO: 8.5 eV, LUMO: 5.0 eV) by using the solution for an electron transport layer according to Synthesis Example 6 instead of the solution for an electron transport layer according to Synthesis Example 3.

Comparative Example 1

An electroluminescent device according to Comparative Example 1 is manufactured according to the same method as Example 1 except for forming an electron transport layer (HOMO: 7.8 eV, LUMO: 4.3 eV) by using the solution for an electron transport layer according to Comparative Synthesis Example instead of the solution for an electron transport layer according to Synthesis Example 3.

Comparative Example 2

An electroluminescent device according to Comparative Example 2 is manufactured according to the same method as Example 5 except for forming an electron transport layer (HOMO: 7.8 eV, LUMO: 4.3 eV) by using the solution for an electron transport layer according to Comparative Synthesis Example instead of the solution for an electron transport layer according to Synthesis Example 3.

Evaluation 1

The solutions for an electron transport layer according to Synthesis Examples 1 and 2 and Comparative Synthesis Example are respectively spin-coated to be 40 nm thick on an ITO substrate and heat-treated at 80° C. for 30 minutes to form each thin film. Subsequently, HOMO and LUMO energy levels of each film are measured through X-ray photoelectron spectroscopy (XPS) by using a Versaprobe surface analysis instrument (PH15000, Ulvac-Phi Inc.), and the results are shown in FIG. 4.

Figure 4:
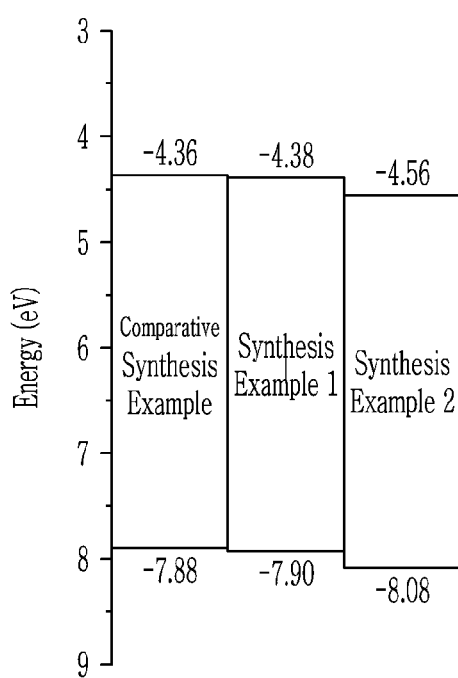
FIG. 4 shows energy band diagrams of the thin films manufactured using solutions for electron transport layers according to Synthesis Example 1 to Synthesis Example 2 and Comparative Synthesis Example.

FIG. 4 shows energy band diagrams of the thin films manufactured using solutions for electron transport layers according to Synthesis Example 1 to Synthesis Example 2 and Comparative Synthesis Example.

Referring to FIG. 4, the thin films having an organic ligand and zinc acetate chemically bound to ZnO nanoparticles according to Synthesis Examples 1 to 2 show a lower LUMO energy level than the thin film having no organic ligand and zinc acetate according to Comparative Synthesis Example. In addition, comparing LIMO energy levels according to Synthesis Examples 1 and 2, as the amount of zinc acetate is increased, the LUMO energy level becomes lower.

Evaluation 2

Luminance-external quantum efficiency and voltage-luminescence characteristics of the electroluminescent devices according to Examples 1 to 8 and Comparative Examples 1 to 2 are evaluated, and the results are shown in FIGS. 5 to 8.

Figure 5:
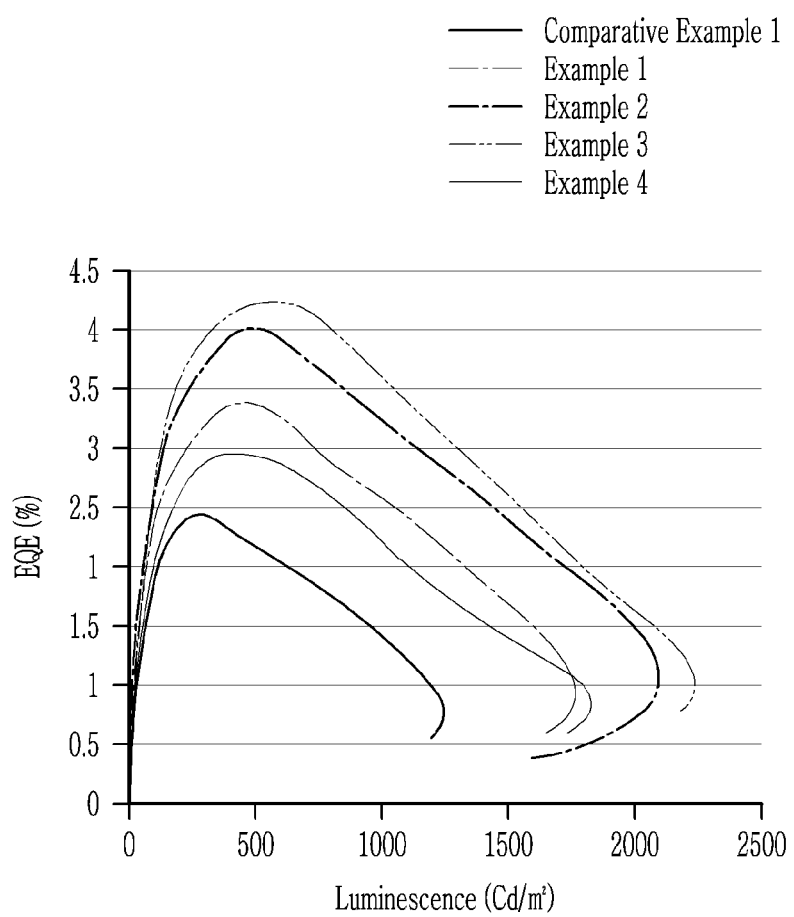
FIG. 5 is a graph of external quantum efficiency (EQE (percent (%))) versus luminescence (candelas per square meter ($Cd/m^2$)) of the electroluminescent devices according to Comparative Example 1 and Examples 1 to 4.
Figure 6:
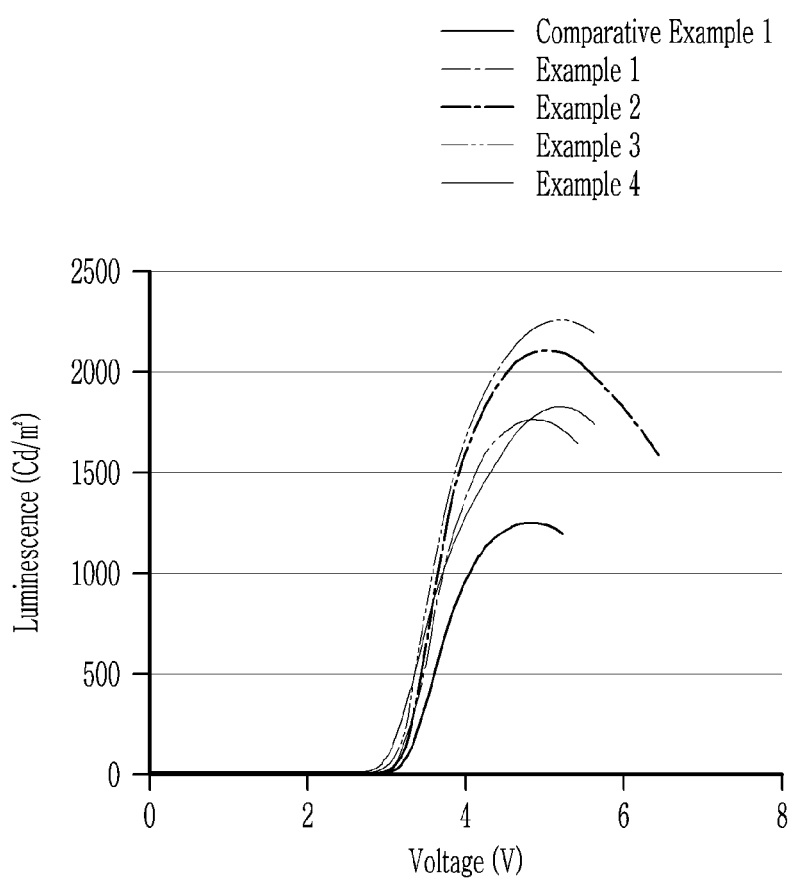
FIG. 6 is a graph showing luminance ($Cd/m^2$) versus voltage (volts (V)) of the electroluminescent devices according to Comparative Example 1 and Examples 1 to 4.
Figure 7:
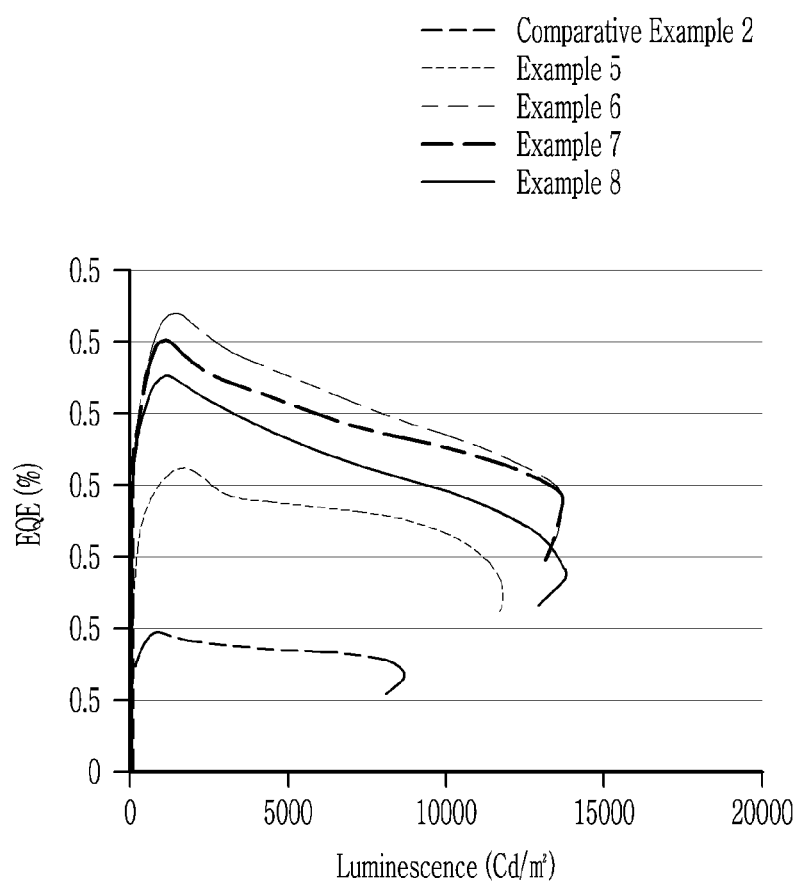
FIG. 7 is a graph showing external quantum efficiency (EQE (%)) versus luminescence ($Cd/m^2$) of the electroluminescent devices according to Comparative Example 2 and Examples 5 to 8.
Figure 8:
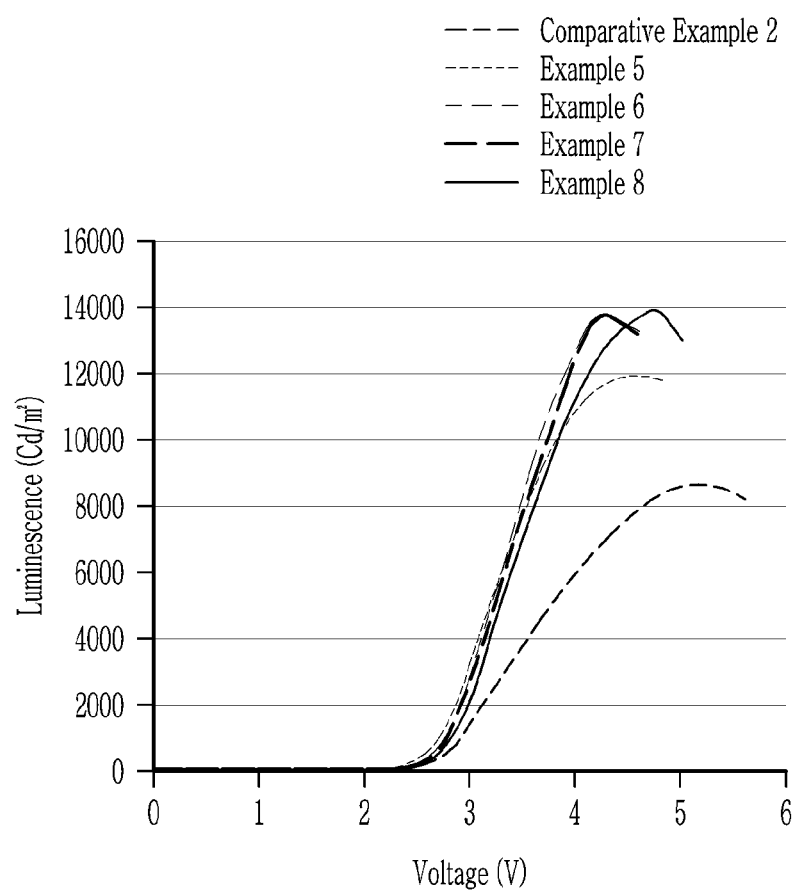
FIG. 8 is a graph showing luminance ($Cd/m^2$) versus voltage (V151) of the electroluminescent devices according to Comparative Example 2 and Examples 5 to 8.

FIG. 5 is a graph showing luminance-external quantum efficiency (EQE) relationships of the electroluminescent devices according to Comparative Example 1 and Examples 1 to 4, FIG. 6 is a graph showing voltage-luminance relationships of the electroluminescent devices according to Comparative Example 1 and Examples 1 to 4, FIG. 7 is a graph showing luminance-external quantum efficiency (EQE) relationships of the electroluminescent devices according to Comparative Example 2 and Examples 5 to 8, and FIG. 8 is a graph showing voltage-luminance relationships of the electroluminescent devices according to Comparative Example 2 and Examples 5 to 8.

Referring to FIGS. 5 to 8, Examples 1 to 8 having an organic ligand and zinc acetate chemically bound to a ZnO core exhibit improved luminance-external quantum efficiency and voltage-luminance relationship compared with Comparative Examples 1 to 2 having no organic ligand and zinc acetate.

In addition, Examples 1 to 4 and 5 to 8 exhibit improved luminance-external quantum efficiency and voltage-luminance relationship, as the amount of zinc acetate in nanoparticles is increased.

Referring to the results of FIGS. 5 and 8, when nanoparticles having a ZnO core and an organic ligand and zinc acetate chemically bound thereto as an electron transport layer are used, device characteristics of an electroluminescent device may be improved by preventing a leakage current and improving a charge carrier balance.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 10: electroluminescent device | 100: substrate |
| 110: first electrode | 120: hole injection layer |
| 130: hole transport layer | 140: emission layer |
| 141: light emitting particles | 150: electron transport layer |
| 151: nanoparticle | 152: core |
| 153: organic ligand | 154: metal-organic compound |
| 160: second electrode | |

What is claimed is:

1. An electroluminescent device, comprising
a first electrode;
a hole transport layer disposed on the first electrode;
an emission layer disposed on the hole transport layer and comprising light emitting particles;
an electron transport layer disposed on the emission layer and comprising nanoparticles having electron transport capability; and
a second electrode disposed on the electron transport layer,
wherein at least a portion of the nanoparticles having electron transport capability comprises
an inorganic oxide core represented by Chemical Formula 1,
an organic ligand attached to a surface of the inorganic oxide core, and
a metal-organic compound chemically bound to the surface of the inorganic oxide core:

$$M_xO_y \qquad \text{Chemical Formula 1}$$

wherein, in Chemical Formula 1,
M is Zn, Ti, Zr, Sn, W, or Ta, and
x and y are independently an integer ranging from 1 to 5.

2. The electroluminescent device of claim 1, wherein a difference between lowest unoccupied molecular orbital energy levels of the emission layer and the electron transport layer is greater than a difference between lowest unoccupied molecular orbital energy levels of the emission layer and ZnO.

3. The electroluminescent device of claim 2, wherein a lowest unoccupied molecular orbital energy level of the electron transport layer is greater than about 4.36 electronvolts and less than or equal to about 5.0 electronvolts.

4. The electroluminescent device of claim 1, wherein the metal-organic compound comprises a metal and an organic compound, wherein the metal of the metal-organic compound comprises Zn, Mg, Al, In, Ga, or a combination thereof.

5. The electroluminescent device of claim 4, wherein the metal of the metal-organic compound is chemically bound to the surface of the inorganic oxide core.

6. The electroluminescent device of claim 4, wherein the organic ligand, the organic compound of the metal-organic compound, or a combination thereof has a hydrophilic moiety.

7. The electroluminescent device of claim 4, wherein the organic compound of the metal-organic compound comprises a carboxylate moiety.

8. The electroluminescent device of claim 7, wherein the carboxylate moiety comprises an acetate moiety, a propionate moiety, an acrylate moiety, or a combination thereof.

9. The electroluminescent device of claim 7, further comprising a carboxylate ligand that is chemically bound to the surface of the inorganic oxide core.

10. The electroluminescent device of claim 7, wherein
the inorganic oxide core comprises ZnO, and
the metal-organic compound comprises a zinc-acetate compound.

11. The electroluminescent device of claim 1, wherein the metal-organic compound is present in an amount of about 1 weight percent to about 40 weight percent, based on a total amount of the nanoparticles having electron transport capability.

12. The electroluminescent device of claim 1, wherein the electron transport layer comprises a cluster layer comprising at least two nanoparticles.

13. The electroluminescent device of claim 1, wherein at least a portion of the light emitting particles comprise quantum dots.

14. The electroluminescent device of claim 1, wherein at least a portion of the light emitting particles have a core-shell structure.

15. The electroluminescent device of claim 1, wherein the light emitting particles comprises a Group II-VI compound that does not comprise Cd, a Group III-V compound, a Group IV-VI compound, a Group IV element or compound, a Group compound, a Group I-II-IV-VI compound that does not comprise Cd, or a combination thereof.

16. The electroluminescent device of claim 1, wherein at least a portion of the light emitting particles comprise a hydrophobic ligand.

17. A display device comprising the electroluminescent device of claim 1.

* * * * *